United States Patent [19]

Bhattacharya et al.

[11] 4,434,434
[45] Feb. 28, 1984

[54] SOLDER MOUND FORMATION ON SUBSTRATES

[75] Inventors: Somnath Bhattacharya, Wappingers Falls; Shih-Ming Hu; Nicholas G. Koopman, both of Hopewell Junction; Chester C. Oldakowski, Poughkeepsie, all of N.Y.

[73] Assignee: International Business Machines Corporation, Armonk, N.Y.

[21] Appl. No.: 249,261

[22] Filed: Mar. 30, 1981

[51] Int. Cl.³ .................... H01L 23/48; H01L 29/44; H01L 29/52; H01L 29/62
[52] U.S. Cl. .......................................... 357/71; 357/68
[58] Field of Search ..................... 357/71, 68

[56] References Cited

U.S. PATENT DOCUMENTS

| | | | |
|---|---|---|---|
| 3,461,357 | 8/1969 | Mutter et al. | 357/71 |
| 3,906,541 | 9/1975 | Goronkin | 357/71 X |
| 4,258,382 | 3/1981 | Harris | 357/71 |
| 4,290,079 | 9/1981 | Carpenter et al. | 357/71 |

OTHER PUBLICATIONS

IBM-TDB, "Fabricating Ohmic Contacts", V. 9, No. 4, Sep. 1966, pp. 430-431, R. M. Chapman.

*Primary Examiner*—Andrew J. James
*Assistant Examiner*—Seth M. Nehrbass
*Attorney, Agent, or Firm*—Henry Powers

[57] ABSTRACT

A controlled geometric configuration of contact pads for securing solder mounds to an integrated circuit chip which reduces cracking of brittle passivating coatings in fabrication of components.

12 Claims, 7 Drawing Figures

SOLDER MOUND FORMATION ON SUBSTRATES

DESCRIPTION

1. Technical Field

This invention relates to semiconductor devices, and more particularly to an improved contact pad for securing solder mound terminals on integrated circuit chips for purposes of flip-chip or face down bonding to metallurgy of a supporting dielectric substrate, e.g. alumina ceramic.

One object of the present invention is to provide improved semiconductor devices.

Another object of the present invention is to provide improved solder terminals on semiconductor devices.

Another object of the present invention is to reduce cracking of fragile and brittle coatings on substrates during formation of solder deposits and subsequent processing thereon.

Another object of the present invention is to enable the formation of solder mound terminals on passivated semiconductor devices, such as integrated circuit chips.

Another object of the present invention is to provide novel ball limiting metallurgy or contact pads to secure solder mound terminals on semiconductor devices passivated with brittle coatings.

Another object of the present invention is to provide novel solder mound limiting metallurgy which reduces cracking of brittle passivating coatings on semiconductor devices when solder mound terminals are formed thereon, and subsequent processing and use thereon.

Another object of the present invention is to reduce intrinsic stresses in brittle passivating layers of semiconductor devices at the periphery of the solder mound limiting metallurgy employed for forming solder terminals on the devices.

2. Background Art

The use of solder mound or ball terminals on semiconductor devices for flip-chip or face-down bonding to a supporting dielectric substrate or module has been employed in the technology. Various methods for such bonding are described in U.S. Pat. Nos. 3,392,442, 3,429,040, 3,436,819, 3,458,925, 3,508,118, 3,631,304 and 4,051,508.

In accordance with one approach, solder ball or mound terminals are formed on semiconductor devices normally passivated with a brittle coating, such as silicon dioxide, glass and quartz. The terminal formation is located at access or contact openings extending through the passivating layer previously coated with a solder mound or ball limiting contact pad which extends through the opening in suitable interconnection to the device circuitry. The contact pads normally comprise circular metallic laminates, such as of chrome, copper and gold.

The solder mounds or balls serve as active contacts when a semiconductor device, comprising an integrated circuit chip, is subsequently flip-chip or face-down bonded to a dielectric supporting substrate having a mirror image of mating contacts in register with the chip solder ball terminals. Typically the dielectric substrate can be an alumina ceramic, or a multi-glass layer coated ceramic structure (such as described in U.S. Pat. No. 3,968,193) similarly having its mating contacts formed of a metallic laminate, also generally of circular configuration.

Although this technique has found extensive use in flip-chip or face-down bonding on dielectric supporting substrates, the integrated circuit chips have been found prone to fracture after formation of the solder mounds or ball terminals, especially when 95Pb-5Sn is used as the solder. The problem is believed to be caused by residual stresses localized in the brittle passivating layer (e.g. $SiO_2$, glass or quartz) near the surface in the immediate neighborhood surrounding the perimeter of the solder ball or mound. This stress is in turn caused by an "edge force" from the solder mound or ball limiting contact pad, which usually exhibits an "intrinsic" tensile stress. This intrinsic stress develops into an "edge force" at the abrupt edge of the contact pad, where the intrinsic stress in the pad is not balanced on opposite sides by substantially equal stresses, as in the interior region of the pad, and must then be balanced by inducing a highly localized tensile stress in the passivating layer, in the immediate neighborhood surrounding the pad. This residual stress, by itself or reinforced by inadvertently externally applied stress, can cause the brittle passivating layer to crack around the solder ball or mound, which can quickly spread through the brittle passivating layer which defeats its function of protecting the semiconductor its function of protecting the semiconductor device.

BRIEF DESCRIPTION OF THE DRAWINGS

In the accompanying drawings forming a material part of this disclosure.

DISCLOSURE OF THE INVENTION

Figure 1:
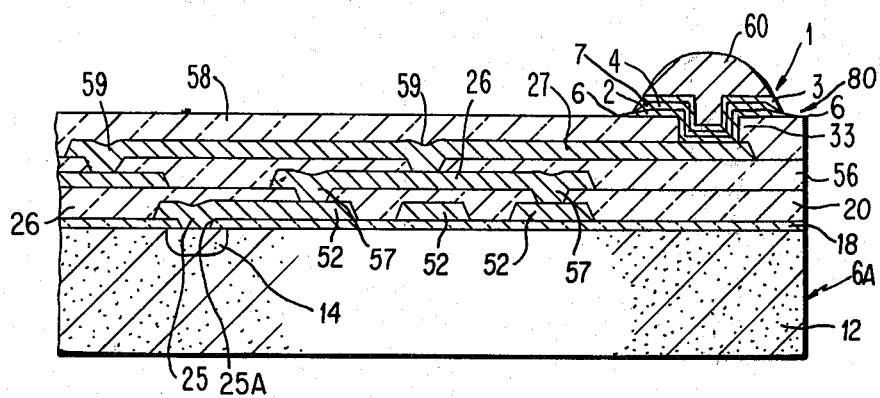
FIG. 1 is a cross-sectional view illustrating an embodiment of this invention employed in forming solder ball or mound terminals for a multilevel metallurgy structure of a hermetically sealed planar semiconductor device.

For further comprehension of the invention, and of the objects and advantages thereof, reference will be had to the following description and accompanying drawings and to the appended claims in which the novel features of the invention are more particularly set forth.

The approach of the present invention for reducing the tendency of brittle passivating layers 58, e.g. quartz, glass, $SiO_2$ etc., to fracture upon formation of solder ball or mound terminal 60 is based on a concept of fracture prevention. In this concept, the residual stresses in the immediate neighborhood of the solder terminal perimeters are designed to be delocalized by distributing and spreading or smearing out the edge stresses imposed by the contact pad structure 1 on the underlying brittle passivating layer 58. The reduction of the localized stresses is obtained by modifying the geometry of the laminated contact pad 1 to incorporate a combined graded and stepped construction of the peripheral portions of the contact pad, herein formed of a bottom chrome layer 2, a top copper layer or mesa 3 and an intermediate layer of an intermix 4 of the copper and chrome.

A chrome coating 2 is deposited first, as by vacuum evaporation, in the contact opening of a brittle passivating layer (e.g. SiO$_2$, quartz or glass) as well as on surrounding portions of the brittle layer, with peripherial portions feathered to tapered point 6, at the periphery, at an angle A (see FIG. 1B) of about 1° to about 10° relative to the surface of the layer. Typically, the maximum thickness of the chrome coating at the plateau 7 (from which the taper begins its narrowing toward the periphery) will be illustratively of the order of about 2K Å to about 3K Å. For purposes of forming the ball limiting contact pad structure, one effective system for this purpose is the multi source Varian Evaporator Model No. 3120, which is schematically shown in FIG. 2C. In this system, as conceptually shown in FIG. 2, a copper source and a chromium source are employed at a distance of about 65 cm from the substrate mounted on a rotating dome. The desired contact structure having a copper element concentrically contained in spaced relationship within the chrome element, is obtained by placing the chrome source 70 off-center, with the copper source 71 on center, with the evaporant deposited through point edged openings 72 of a suitable mask 73, e.g. of molybdenum. Rotation of the substrate during evaporation is the key to keeping symmetry and making the "virtual source" of the chromium appear much larger in the contact pad area than the copper which is idled during the chrome deposition. It is noted that since the technique is inherently dependent on the shadowing by the edge 74 of mask 73, it is necessary to use a mask which has the "knife-edge" 74 significantly spaced from the wafer surface 75. Other mask configurations are shown in FIGS. 2A and 2B, with the latter comprising a relatively thick lift-off type structure having a suitable shadowing layer 76. Typically, in the Varian system noted, the knife-edge 74 will be illustratively spaced about 25μ to about 100μ from the substrate surface 75.

In actual practice with use of the indicated Varian system, a plurality of wafers will be mounted on a rotating dome 91, as shown in FIG. 2C. Also, as shown the system will include a laterally spaced gold source 90, for optional coating of gold on the contacts for protection thereof against oxidation, corrosion, etc. in ambients.

After deposition of the chrome layer element 2 (see FIGS. 1 to 1B), the copper source 71 is unscreened, and the copper coevaporated with the chrome to form the Cr/Cu contact element 4 (see FIG. 1A, for example) constituting an intermix or admixture of the metals wherein the ratio of Cr to Cu is in the range of about 75:25 to about 25:75. The codeposition is continued until a maximum thickness of about 300 Å to about 1000 Å is obtained. This Cr/Cu contact element 4 is formed concentrically with Cr element 2, with the perimeter of the Cr/Cu element 4 spaced inwardly relative the perimeter of the Cr element 2 so as to retain an annular chrome ring 80. As will be noted, during the Cr/Cu deposition, chrome will be continued to be deposited on the chrome annular ring 80.

On completion of the formation of the Cr/Cu contact element 4, the chrome source 70 is screened, with the copper source remaining active to complete the formation of the contact pad 1 by deposition of the copper contact element 3 to the desired thickness illustratively in the range of about 1K Å to about 20K Å. The perimeter of the Cu contact element 3 will be substantially coincident with the perimeter of the Cr/Cu contact element 4, and will have an outward tapered wedge shaped peripheral portion whose sides will form an angle C of about 1° to about 20° with the horizontal.

On completion of Cu evaporation, 1K Å of Au is optionally evaporated on top of Cu for oxidation prevention prior to subsequent PbSn evaporation and reflow.

Figure 2:
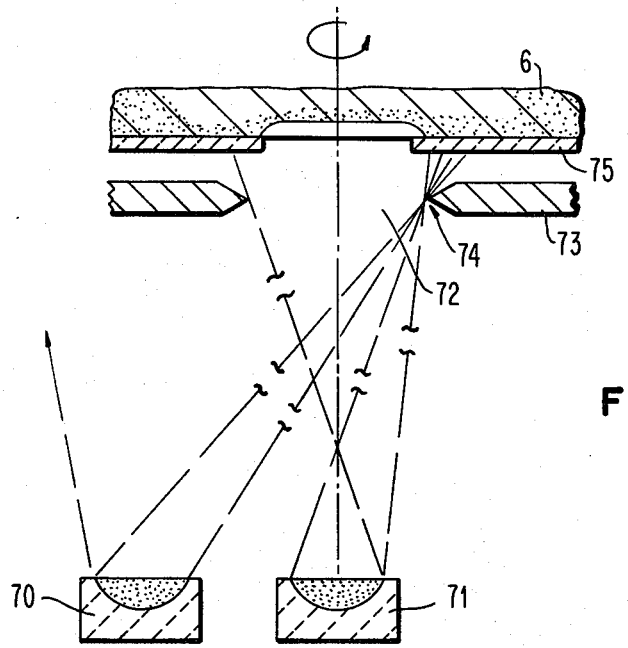
FIG. 2 is a schematic of a conceptualized apparatus for forming the contact pad structure of this invention.

For purposes of illustrating the application of the novel solder ball limiting contact pad of this invention to the fabrication of semiconductor devices it will be described in conjunction with the fabrication of the integrated circuit shown in FIG. 2 of U.S. Pat. No. 3,461,357, which is embodied in FIG. 1 herein. As shown, this embodiment utilized the contact pad of this invention in conjunction with multilevel interconnection metallurgy mounted on a semiconductor device 6. The device 6 has a semiconductor body, e.g. silicon 12 of one conductivity type with a silicon dioxide layer 18 on the upper surface thereof. Formed in the silicon substrate 12 is a diffused region 14 of an opposite conductivity type. The first level of metallurgy comprises a conductor pattern 52, a portion 25 of which is in contact with region 14 through an aperture 25A in the oxide layer 18. Other portions of the conductor pattern 52 extend on the surface of the oxide layer 18. An insulating layer 20, e.g. glass or quartz, is formed over the layer 18 and the first level conductor pattern 52. A second level conductor pattern 26 is formed on insulation 20, and interconnects with the first level metallization through via holes 57, extending through glass layer 20. The assembly is then overcoated with another glass or quartz layer 56. Overlying the layer 56 and the third level metallization 27 is a top bonded passivating layer 58, normally of brittle compositions such as quartz, glass, silicon dioxide and the like. Electrical contact to the third level metallization 27 is made through apertures 33 in the top passivating layer 58 by a solder ball 60 and contact pad structure 1.

Figure 1A:
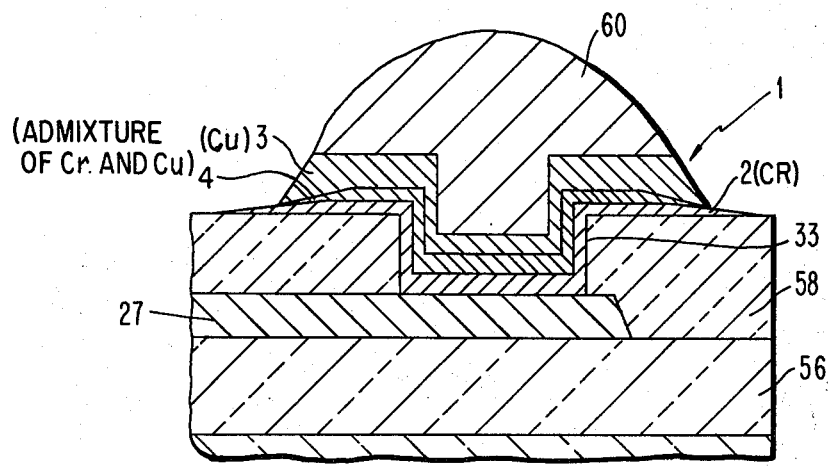
FIG. 1A is an enlarged cross-sectional view of the solder ball terminal of FIG. 1 illustrating the novel contact pad structure of this invention for securing the solder terminal on a device.
Figure 1B:
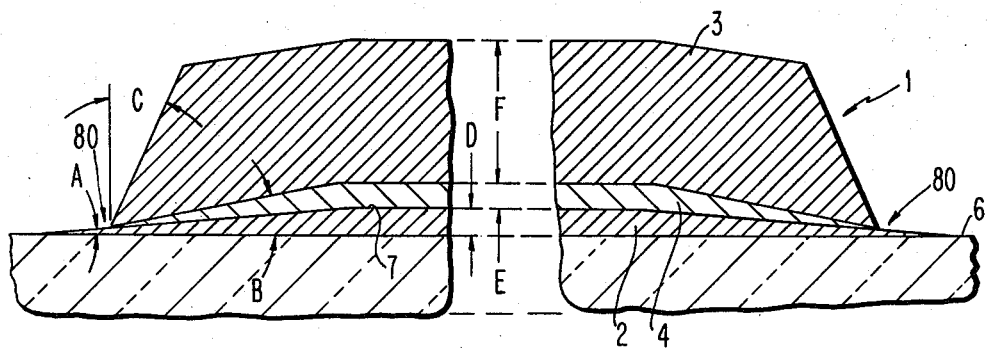
FIG. 1B is an exaggerated view of the peripheral portions of the contact pad of the preceding figures.
Figure 2A:
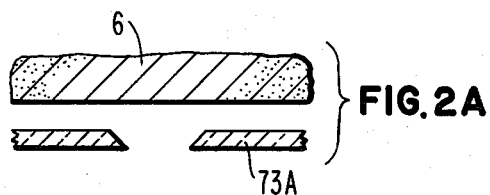
FIGS. 2A and 2B are schematic cross-sectional view of mask structure for use in the system of FIG. 2.
Figure 2B:
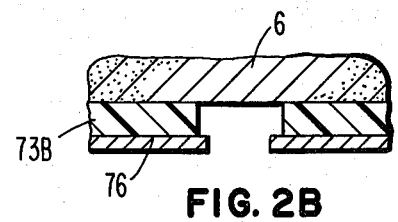
Figure 2C:
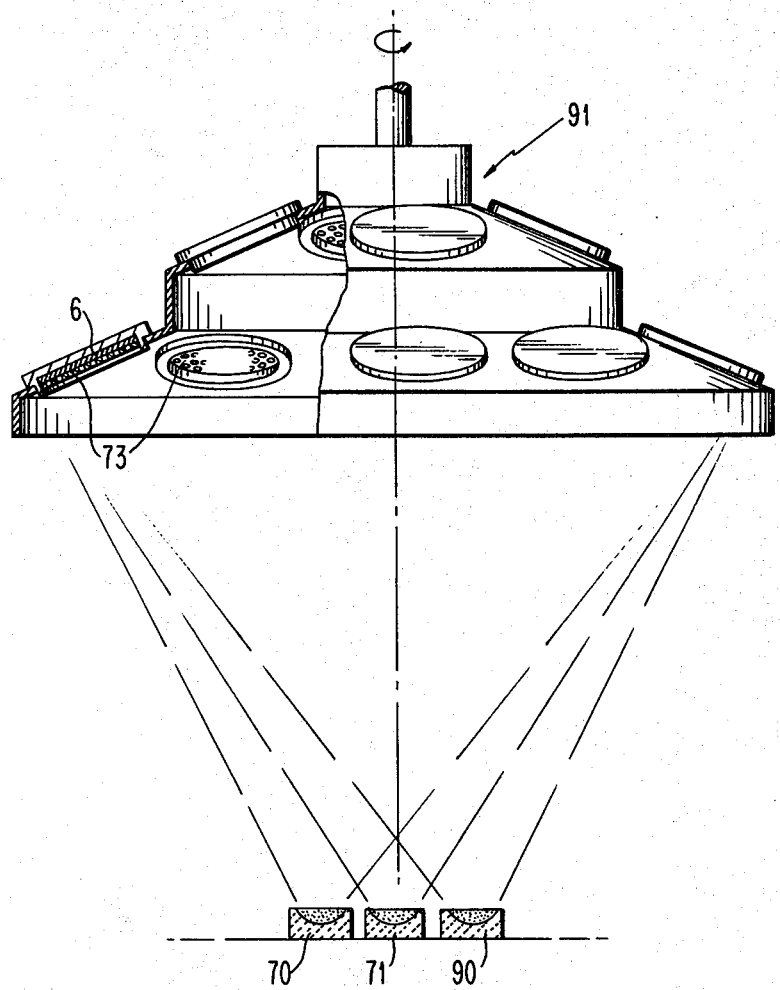
FIG. 2C is a simplified schematic of a commercial unit of the apparatus of FIG. 2.

The solder ball limiting contact pad is formed in accordance with this invention, as discussed above, and will be comprised of a lower chromium element 2, on intermediate Cr/Cu element 4 and a copper element 3, and finally 1K Å of Au on top (not shown) see FIGS. 1A and 1B for details.

The solder ball terminal 60 can be formed as described in U.S. Pat. No. 3,458,925. To this end a suitable mask, as of molybdenum, having holes therein corresponding to and somewhat larger than the ball limiting contact pads 1 is placed over the device 6 so that the holes of the mask are concentric to pads. A layer of solder, such as a lead-tin alloy, is then evaporated through the mask holes to completely cover the contact pads 1 and the surrounding portions of the passivating layer 58. After the solder evaporation is completed, the mask is removed, and the device heated to reflow the solder, which, as it melts, gradually dewets the surfaces of the passivating layer 58, and draws-up into the desired ball or mound configuration 60 on top of the contact pad 1.

After completion of the device 6, the unit is then ready for flip-chip or face-down bonding to a supporting substrate in accordance with the various technique of the afore indicated prior patents.

For example, the invention will work as well in situations where wire bonding instead of solder reflow technique is used for interconnections. Furthermore, the invention will work equally well when metallurgies such as TiCuAu, TiRhAu, etc. are employed instead of CrCuAu, which makes phasing unnecessary because of the mutual solubilities of various metals.

While the invention has been illustrated and described with respect to specific embodiments of this invention, it is to be understood that the invention is not to be limited to the precise constructions herein disclosed and the right is reserved to all changes and modifications coming within the scope of the invention as defined in the appended claims.

Having thus described the invention, what is claimed as new and desired to be secured by Letters Patent is:

1. Solder support pads for brittle coatings of substrates comprising:
   a first layer of chromium on said coating with outwardly tapered wedge-shaped peripheral portions;
   a second concentric layer of an admixture of chromium and copper over and concentric with said first layer, said second layer having outwardly tapered wedge-shaped peripheral portions defining a perimeter disposed in inward spaced relationship relative to the perimeter of said first layer to leave an annular ring of said first layer adjacent the perimeter thereof; and
   a third layer of copper over and concentric with said second layer, said third layer outwardly tapered wedge-shaped peripheral portions with the perimeter thereof in substantially coincident relationship with the perimeter of said second layer.

2. The support pads of claim 1 including a mass of solder on said pads.

3. The support pads of claim 1 including a via hole in said coating opposite the central portions of said pad with said pad extending therethrough to said substrate.

4. The support pads of claim 3 including a mass of solder on said pads.

5. The support pads of claim 1 wherein said coating is selected from the group of glass, quartz and silicon dioxide compositions.

6. The support pads of claim 5 including a mass of solder on said pads.

7. The support pads of claim 5 including a via hole in said coating opposite the central portions of said pad with said pad extending therethrough to said substrate.

8. The support pads of claim 7 including a mass of solder on said pads.

9. Contact metallurgy for an integrated semiconductor substrate having circuit elements therein comprising:
   a dielectric coating on said substrate having an aperture therethrough for electrical connection to one of said circuit elements in said substrate;
   a contact pad comprising;
   a first layer of chromium over said aperture with outwardly tapered wedge-shaped peripheral portions extending on said coating externally of said aperture;
   a second concentric layer of an admixture of chromium and copper over and concentric with said first layer, said second layer having outwardly tapered wedge-shaped peripheral portions defining a perimeter disposed in inwardly spaced relationship relative to the perimeter of said first layer to leave an annular ring of said first layer adjacent the perimeter thereof; and
   a third layer of copper over and concentric with said second layer, said third layer having outwardly tapered wedge-shaped peripheral portions with the perimeter thereof in substantially coincident relationship with perimeter of said second layer.

10. The structure of claim 9 including a solder mound on said pad.

11. The structure of claim 9 wherein said coating is selected from the group of glass, quartz and silicon dioxide compositions.

12. The structure of claim 11 including a solder mound on said pad.

* * * * *

UNITED STATES PATENT AND TRADEMARK OFFICE
CERTIFICATE OF CORRECTION

PATENT NO. : 4,434,434

DATED : February 28, 1984

INVENTOR(S) : S. Bhattacharya; S-M. Hu; N.G. Koopman and C.C. Oldakowski

It is certified that error appears in the above-identified patent and that said Letters Patent is hereby corrected as shown below:

Claim 1, line 31, before "outwardly" insert --having--.

Signed and Sealed this

Twentieth Day of August 1985

[SEAL]

*Attest:*

DONALD J. QUIGG

*Attesting Officer*     *Acting Commissioner of Patents and Trademarks*